US008814400B2

(12) United States Patent
Warton et al.

(10) Patent No.: US 8,814,400 B2
(45) Date of Patent: Aug. 26, 2014

(54) FIXTURE SUPPORT SYSTEM AND METHOD

(75) Inventors: Thomas Warton, Sonoma, CA (US); Scott Yu, Mill Valley, CA (US)

(73) Assignee: Vode Lighting LLC, Sonoma, CA (US)

( * ) Notice: Subject to any disclaimer, the term of this patent is extended or adjusted under 35 U.S.C. 154(b) by 754 days.

(21) Appl. No.: 12/838,338

(22) Filed: Jul. 16, 2010

(65) Prior Publication Data

US 2011/0176318 A1 Jul. 21, 2011

Related U.S. Application Data

(60) Provisional application No. 61/229,463, filed on Jul. 29, 2009.

(51) Int. Cl.
*F21S 8/06* (2006.01)
*H05K 13/00* (2006.01)

(52) U.S. Cl.
USPC .......... 362/413; 29/525.02; 29/854; 174/520; 52/126.1

(58) Field of Classification Search
USPC .............. 29/525.02, 854; 403/299; 174/65 R; 52/126.6, 126.1, 126.4, 126.7, 220.1, 52/263; 362/413
See application file for complete search history.

(56) References Cited

U.S. PATENT DOCUMENTS

| | | | | | |
|---|---|---|---|---|---|
| 3,951,139 | A * | 4/1976 | Kloots | 600/249 |
| 4,229,614 | A * | 10/1980 | Smolik | 174/58 |
| 4,406,483 | A * | 9/1983 | Perlman | 285/139.1 |
| 4,457,544 | A * | 7/1984 | Snow et al. | 285/251 |
| 4,780,571 | A * | 10/1988 | Huang | 174/484 |
| 5,107,072 | A * | 4/1992 | Morgan | 174/487 |
| 5,286,216 | A * | 2/1994 | Volz | 439/236 |
| 5,552,673 | A * | 9/1996 | Kenwood | 315/57 |
| 5,663,525 | A * | 9/1997 | Newman | 174/50 |
| 5,700,977 | A * | 12/1997 | Ford et al. | 174/64 |
| 5,769,000 | A * | 6/1998 | Dunfey | 108/23 |
| 6,194,658 | B1 * | 2/2001 | Duval | 174/64 |
| 6,196,859 | B1 * | 3/2001 | Garlarza | 439/369 |
| 6,621,646 | B2 * | 9/2003 | Jung | 359/802 |
| 6,969,802 | B1 * | 11/2005 | George | 174/666 |
| 6,983,570 | B2 * | 1/2006 | Mead | 52/263 |
| 6,994,457 | B2 * | 2/2006 | Lee | 362/366 |
| 7,053,296 | B2 * | 5/2006 | Drane et al. | 174/483 |
| 7,077,281 | B2 * | 7/2006 | Sato et al. | 220/3.8 |
| 7,105,742 | B1 * | 9/2006 | Jolly | 174/50 |
| 7,271,351 | B2 * | 9/2007 | Drane | 174/483 |
| 7,390,027 | B2 * | 6/2008 | Kiely | 285/151.1 |
| 7,604,209 | B2 * | 10/2009 | Warton et al. | 248/200 |
| 7,650,725 | B2 * | 1/2010 | Mead | 52/263 |
| 7,921,612 | B2 * | 4/2011 | Knight et al. | 52/126.6 |

(Continued)

*Primary Examiner* — Peter DungBa Vo
*Assistant Examiner* — Kaying Kue
(74) *Attorney, Agent, or Firm* — Antero & Tormey LLC; Peter J. Tormey

(57) ABSTRACT

A fixture having a cylindrical body, said body having an internal cavity extending from a first end to a second end, and said body having an exterior threaded portion, a flange affixed to the first end of the body, a portion of said flange extending past the circumference of the cylindrical body, said flange formed for receiving an electrical component, and a fastener complementary to the threaded portion, wherein the fastener and the flange are operable to secure the cylindrical body to a structure. An electrical component such as a luminaire, a switch or an electrical receptacle may be mounted into the flange portion of the fixture. A retainer may also be employed to distribute the load on the cylindrical body when positioned over the body and secured by the fastener.

13 Claims, 6 Drawing Sheets

(56) References Cited

U.S. PATENT DOCUMENTS

D657,905 S * 4/2012 Yu ................................ D26/138
D659,900 S * 5/2012 Yu ................................ D26/138
2005/0035594 A1* 2/2005 Kiely ......................... 285/154.1
2005/0036321 A1* 2/2005 Ward ............................ 362/365
2008/0184483 A1* 8/2008 Mayer ................................ 4/679
2009/0201683 A1* 8/2009 Chuan ........................... 362/294

* cited by examiner

FIXTURE SUPPORT SYSTEM AND METHOD

This patent application claims the benefit of U.S. Provisional Patent Application No. 61/229,463, entitled "Luminaire System and Method" filed Jul. 29, 2009 by the inventors George Mieling, Thomas Warton and Scott S. Yu.

The present invention relates generally to fixture supports, and more particularly to a system and method for mounting electrical and lighting fixtures to a support structure.

BACKGROUND

Lighting and electrical fixture system designs are driven by new technologies and by demands for more efficiency from the market. These demands include economic concerns governing the price and operational costs of the system and other concerns such as environmental issues that influence consumer buying behaviors. To meet these demands fixture designers attempt to control costs by creating reusable components that provide for multiple uses of a same or similar component. Reusability provides for economies of scale during manufacturing of the system elements. Additionally, reusable components reduce installation costs because, once standardized, people installing the fixture do not need additional training.

For industrial environments, one consumer demand may be for modularity because modular systems often have lower overall costs and allow consumers of the product the ability to make modifications even after a system is installed. In addition, modularity may provide for "on the fly" adjustments to meet last minute consumer requirements. These requirements may include the ability to rearrange an office or workspace setting in response to changes in the needs of the organization.

Lighting fixture designers strive to meet changing demands by incorporating new technologies and modern aesthetics into fixture designs. As such, what is needed is a cost effective modular lighting fixture that provides for ease of installation.

SUMMARY

Disclosed herein is a fixture having a cylindrical body, said body having an internal cavity extending from a first end to a second end, and said body having an exterior threaded portion, a flange affixed to the first end of the body, a portion of said flange extending past the circumference of the cylindrical body, said flange formed for receiving an electrical component, and a fastener complementary to the threaded portion, wherein the fastener and the flange are operable to secure the cylindrical body to a structure.

An electrical component such as a luminaire, a switch or an electrical receptacle may be mounted into the flange portion of the fixture. A retainer may also be employed to distribute the load of the cylindrical body when positioned over the body and secured by the fastener.

The construction and method of operation of the invention, however, together with additional objectives and advantages thereof will be best understood from the following description of specific embodiments when read in connection with the accompanying drawings.

DESCRIPTION

Generality of Invention

Figure 1:
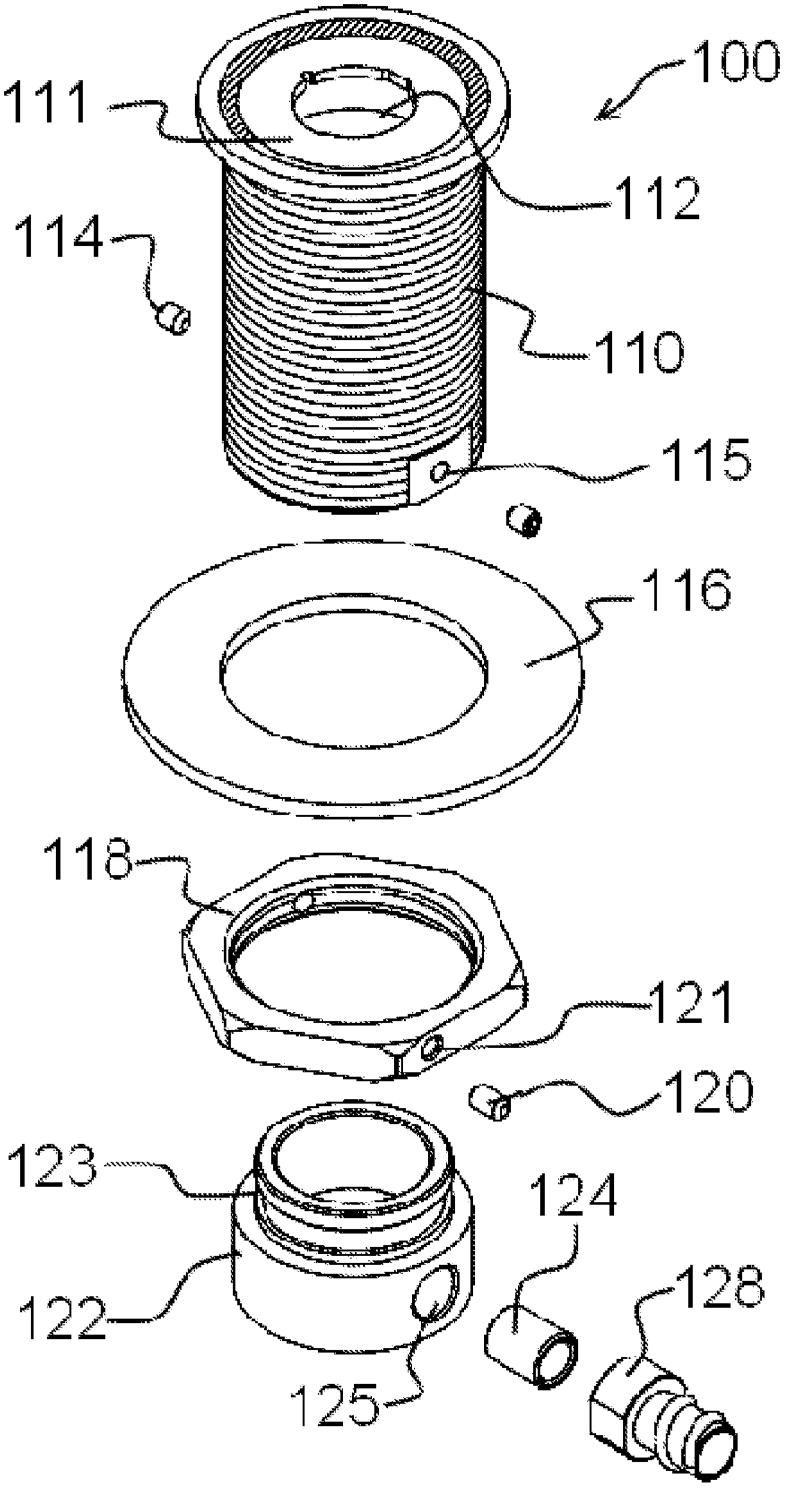
FIG. 1 is an exploded view of one portion of a fixture support.

This application should be read in the most general possible form. This includes, without limitation, the following:

References to specific techniques include alternative and more general techniques, especially when discussing aspects of the invention, or how the invention might be made or used.

References to "preferred" techniques generally mean that the inventor contemplates using those techniques, and thinks they are best for the intended application. This does not exclude other techniques for the invention, and does not mean that those techniques are necessarily essential or would be preferred in all circumstances.

References to contemplated causes and effects for some implementations do not preclude other causes or effects that might occur in other implementations.

References to reasons for using particular techniques do not preclude other reasons or techniques, even if completely contrary, where circumstances would indicate that the stated reasons or techniques are not as applicable.

Furthermore, the invention is in no way limited to the specifics of any particular embodiments and examples disclosed herein. Many other variations are possible which remain within the content, scope and spirit of the invention, and these variations would become clear to those skilled in the art after perusal of this application.

Lexicography

Read this application with the following terms and phrases in their most general form. The general meaning of each of these terms or phrases is illustrative, not in any way limiting.

The term "fixture" generally means a device for physically supporting an electrical component such as a luminaire, switch assembly, electrical outlet or other like devices.

The term "luminaire" generally refers to a lighting fixture which may include either a light source, a lamp, a reflector for directing the light, an aperture (with or without a lens), an outer shell or a housing for lamp alignment and protection, an electrical ballast (if required), and a connection to a power source.

The term "component" or "electrical component" generally means a device used to provide access to or control an electrical power system such a luminaire, a luminaire support, a switch, electrical outlet and like devices.

The term "receptacle" generally means a physical structure for receiving another physical structure through the use of an opening or protrusion.

The term "electrical receptacle", "power receptacle" and the like generally refer to receptacles whose primary function is to couple electrical energy.

DETAILED DESCRIPTION

Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Elements

FIG. 1 is an exploded view of one portion of a fixture support 100. In the FIG. 1 a threaded tubular body 110 is connected to a top plate 111. The threaded body may be substantially threaded along its length or it may only be partially threaded. The top plate 111 is disposed on the body such that a portion of the top plate 111 extends out beyond the circumference of the threaded body 110. The top plate may include an ornamental design. These designs include but are not limited to a recessed area, a beveled area (as shown) or any number of aesthetic designs appropriate to the fixture use. Disposed centrally to the top plate 111 is an opening or hole 112 which provides access to a central portion of the threaded body 110. The opening 112 is shaped to allow for a component to be inserted, consequently the shape of the opening 112 will change according to the use of the fixture. The central portion of the threaded body 110 is a passage extending continuously through the body 110. The body 110 and the top plate 112 may be constructed from any suitable material. The inventors contemplate constructing the body 110 and the top plate 112 from aluminum, and the top plate 112 may be formed from a different material than the body 110. The body 110 has two threaded holes 115 for receiving a threaded fastener such as a set screw 114.

A retaining ring 116 is sized to fit over the threaded body 110 such that when in place, the retaining ring 116 fits snug against the top plate 111. The retaining ring may be held in place with a fastener 118. The fastener 118 is threaded to match the threading on the body 110. The fastener 118 may have sides shaped to allow for gripping with a tool. As shown the fastener 118 has a hexagonal shape on the exterior, however, one having skill in the art will recognize that other shaped fastener may be use for the same effect. These include by way of example, but not a limitation, square fasteners, knurled fasteners and others.

The fastener 118 has a threaded hole 121 through the fastener such that a device such as set screw 120 may be placed through the threaded hole 121 and make contact with the body 110, thus providing a means to lock the fastener 118 in place once the fastener 118 is in position.

A cover 122 is formed to have a threaded portion 123 and an opening 125. The threaded portion 123 is formed to mate with a comparable threading on the inside of the body 110 opposite end of the top plate 111. The cover 122 is hollow to allow the disposition of wires (not shown) or other devices from outside the cover 122, through the opening 125 and into the interior of the body 110 and up to the opening 112 on the top plate 111.

A ferrule 124 or other protective device may be inserted in the hole 125 for use in coupling the hole 125 to a conduit connector 128.

In operation the fixture 100 is placed through an opening in a support structure. The structure may be a desk or table top or other piece of furniture. The opening in the furniture should be sized slightly larger than the diameter of the body 110. The body 110 may be placed through the opening such that the top plate 111 abuts the opening. The retainer 118 is threaded onto the body 110 and tightened against the furniture opposite the top plate 111. The hole 112 provides for mounting fixtures and the cover 122 and hole 125 provide a means for providing electrical power to those fixtures as described below.

References in the specification to "one embodiment", "an embodiment", "an example embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure or characteristic is described in connection with an embodiment, it is submitted that it is within the knowledge of one of ordinary skill in the art to effect such feature, structure or characteristic in connection with other embodiments whether or not explicitly described. Parts of the description are presented using terminology commonly employed by those of ordinary skill in the art to convey the substance of their work to others of ordinary skill in the art.

Components

Figure 2:
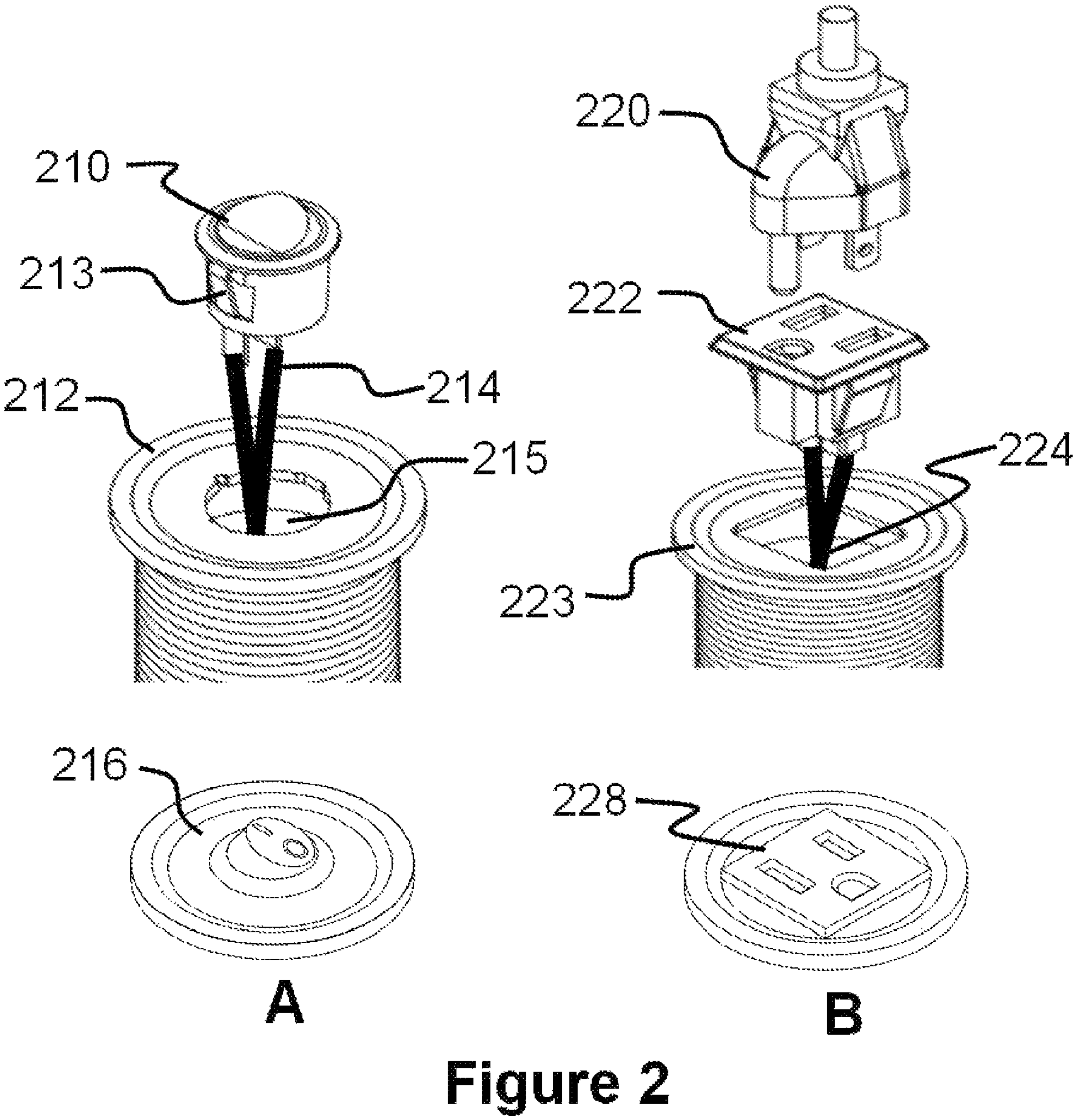
FIG. 2 illustrates different components for use with the fixture support system.

FIG. 2 illustrates different components for use with the fixture support system. In the FIG. 2A a switch assembly 210 is electrically connected to wires 214. The switch assembly may be any of a number of commercial switches including, but not limited to rocker switches, toggle switches, levers or paddle switches. Any of these may be single or multi-polar. The switches may have snaps 213 on the sides for providing a fastening means to a fixture 212. The fixture 212 has an opening 215 on a top flange for receiving the switch assembly 210. The opening 215 is formed to provide a surface for the snaps 213 to snap into. The wires 214 from the switch assembly 210 are extended into a cavity in the fixture 212 and pass through part of the fixture 212 before being coupled to a power source of other electrical device being operated by the switch 210. In some embodiments the wires 214 may be coupled to the electrical component through a removable connector to allow for easy installation and removal of the electrical component.

In the FIG. 2B an electrical outlet 222 is provided for coupling to a power cord 220. The electrical outlet is coupled to power wires which are fed through the fixture 223 through opening 224. The opening 224 is designed to fit the electrical outlet 222, such that the electrical outlet 222 snaps into the opening 224. The electrical outlet 222 may be any of many commercially available electrical outlets including, but not limited to, single and double electrical sockets and receptacles. The fixture may be sized proportionately and as required by the components. For example, but not limiting, the components 216 and 228 may use different size flanges or openings 215.

Although an electrical power outlet is shown, one having skill in the art will recognize that the outlet may be replaced with many other types of connectors, including, but not limited to Ethernet connectors, telco connectors and DIN connectors.

Modularity

Figure 3:
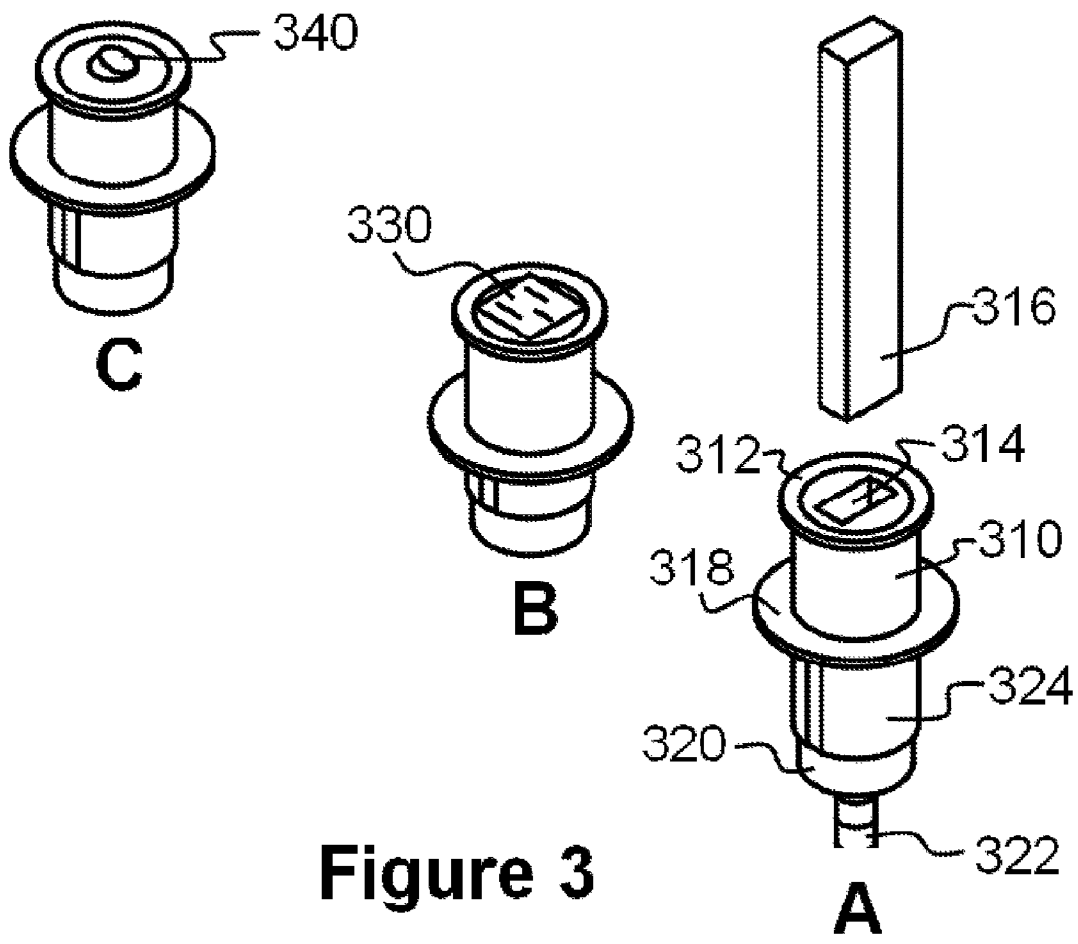
FIG. 3 illustrates an anchor fixture for supporting a luminaire and other components.

FIG. 3 illustrates an anchor fixture for supporting a luminaire and other components. The anchor fixture comprises a cylindrical body 310 having a top flange 312 extending radially from the cylindrical body 310. On a top surface is a bore 314, shown as a rectangular bore in FIG. 5A. The rectangular bore 314 is designed to receive a luminaire support 316. A portion of the cylindrical body 310 is threaded and removable flange 318 is designed to fit snugly against the cylindrical body 310 and the cylindrical body 310 has a raised portion or top flange 312 for catching and holding the flange 318. A fastener (not shown) may be screwed onto a threaded portion 324 of the cylindrical body 310. It is noted that structural support of the arm 316 may require a longer body 310, whereas other components such as electrical receptacle 310 and switch 340 may only require a shorter body 310. Note also that a portion of the body may extend above a mounting surface and different flanges may be used to effectuate the fixture support system. An escutcheon 320 may be used to finish the bottom portion of the cylindrical body 310 and act as a pass-through and conduit connector to allow the passage of cabling for distribution into the cylindrical body from the conduit 322.

In operation the cylindrical body 310 is disposed through an opening in a surface where the anchor fixture is to be mounted. The flange 312 may abut one surface whereas the flange 318 would abut a surface on the opposite side. The tightening assembly can be placed over the cylindrical body 310 and tightened and thus hold the anchor fixture in place. Note the tightening assembly may be a simple as a threaded nut. The conduit 322 provides a means for electrical wires to pass into cylindrical body and access to the electrical wires can be reached through the bore 314. It is noted that the bore 314 is shaped for receiving whatever device or component may be placed into the anchor fixture. Additionally the escutcheon 320 and conduit 322 may be configured to come off at different angles than shown in the FIG. 3A thus allowing for more flexibility in the manufacture and in-the-field assembly of the anchor fixture. Quick disconnect connectors may be connected to power lines extending into bore 314, allowing for easy installation of powered fixtures.

Once in place the anchor fixture receives a luminaire support 316. The luminaire support may be configured to hold many of a variety of different types of luminaires, thus the anchor fixture is used as a mount for a luminaire system. Additionally the anchor fixture may provide for other electrical needs with the addition of different options. By way of example, but not limiting, is the FIG. 3B which shows an electrical outlet 330 wherein the anchor fixture is configured to be a power outlet thus allowing electrical power from the conduit 322 to the electrical receptacle on the other side of the support surface when the anchor fixture is anchored in place. Similarly FIG. 3C shows a power switch 340 mounted on the anchor fixture. Electrical power could be routed through the conduit 322 up to the anchor fixture to the switch 340, then back from the switch downstream to whatever devices the switch is designed to control. Modularity allows for not only different luminaires but different electrical and structural devices to be configured to fit into the anchor fixture. Also the bore 314 may be shaped to fit whatever is necessary for particular installation to meet predetermined mechanical or other design requirements such as a circular or oval bore.

Luminaire Support

Figure 4:
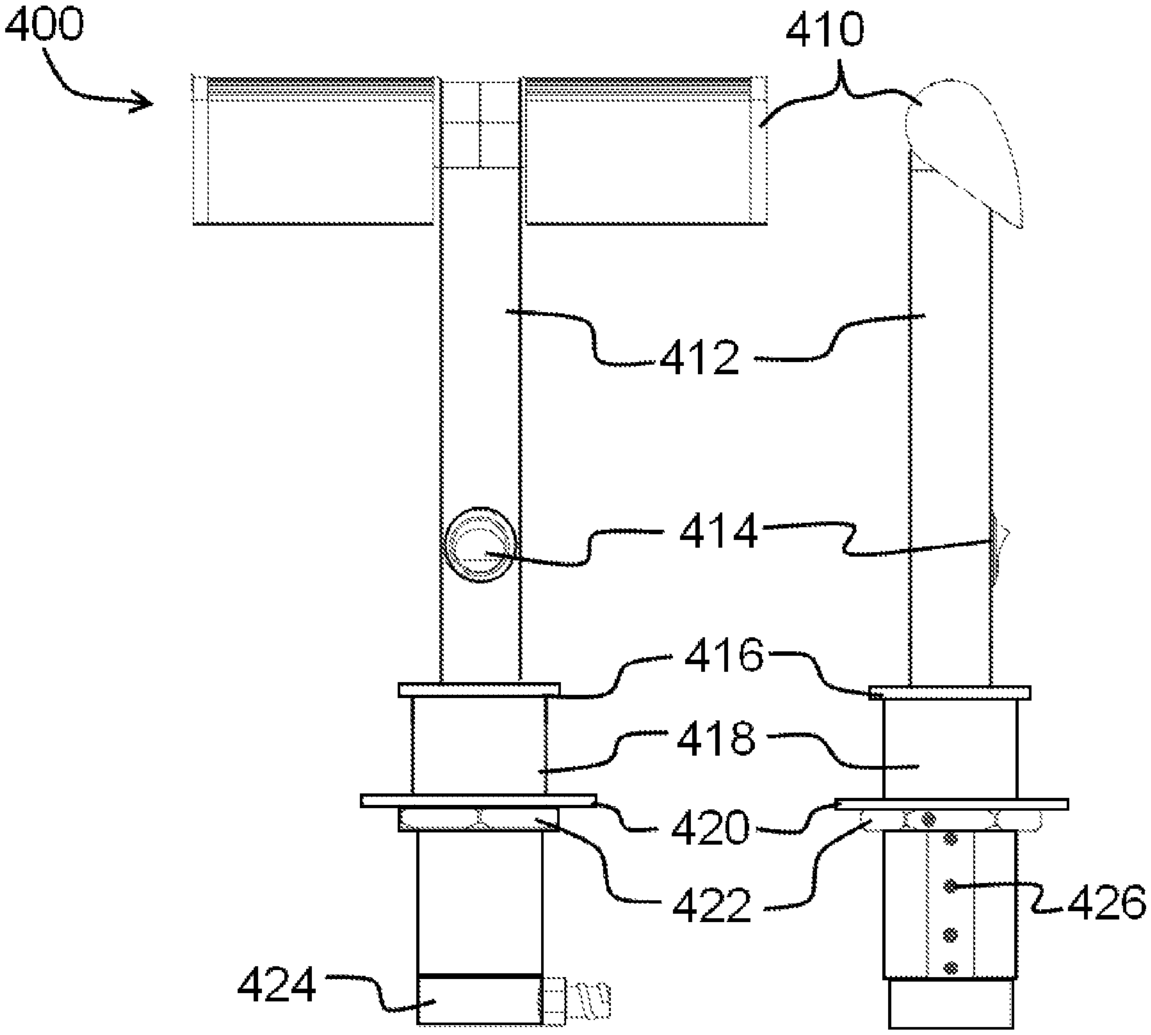
FIG. 4 illustrates a luminaire mounted in a fixture support.

FIG. 4 illustrates a luminaire mounted in a fixture support 400. The FIG. 4A depicts a front view and the FIG. 4B depicts a profile view. A toggle type on/off power switch 414 is disposed into an arm 412 for controlling the luminaire 410. The arm swivels about base 416, which in operation would be disposed above the mounting surface (not shown). The base 416 is affixed atop a body 418. The body 418 may be partially threaded to allow for coupling to a hex nut, clip or other threaded fastener 422. The hex nut 422 may be used to hold in place a retainer 420 such as a washer and the like. Together the hex nut 422 and retainer 420 form a part of a means for fastening the body 418 to a surface. A portion of the body has threaded holes 416 for receiving screws such as set screws. When the arm 412 is positioned into an opening in the base 416 and into the body 418, the set screws 426 are used to secure the arm in place. A hollow cover 424 is affixed to the bottom of the fixture support opposite side of the base.

In operation, electrical power is supplied through an opening in the cover 242 into the body 418 and into the arm 412. The electrical power is wired through the switch 414 before being coupled to the luminaire 410. A user controls the luminaire 410 by operating the switch 414. One having skill in the art will appreciate that other control devices such as occupancy sensors may be employed in lieu of, or along with, the switch 414, thus effectuating control of the luminaire using more advanced means. In addition, power for other devices besides the luminaire may be routed through the fixture support.

Figure 5:
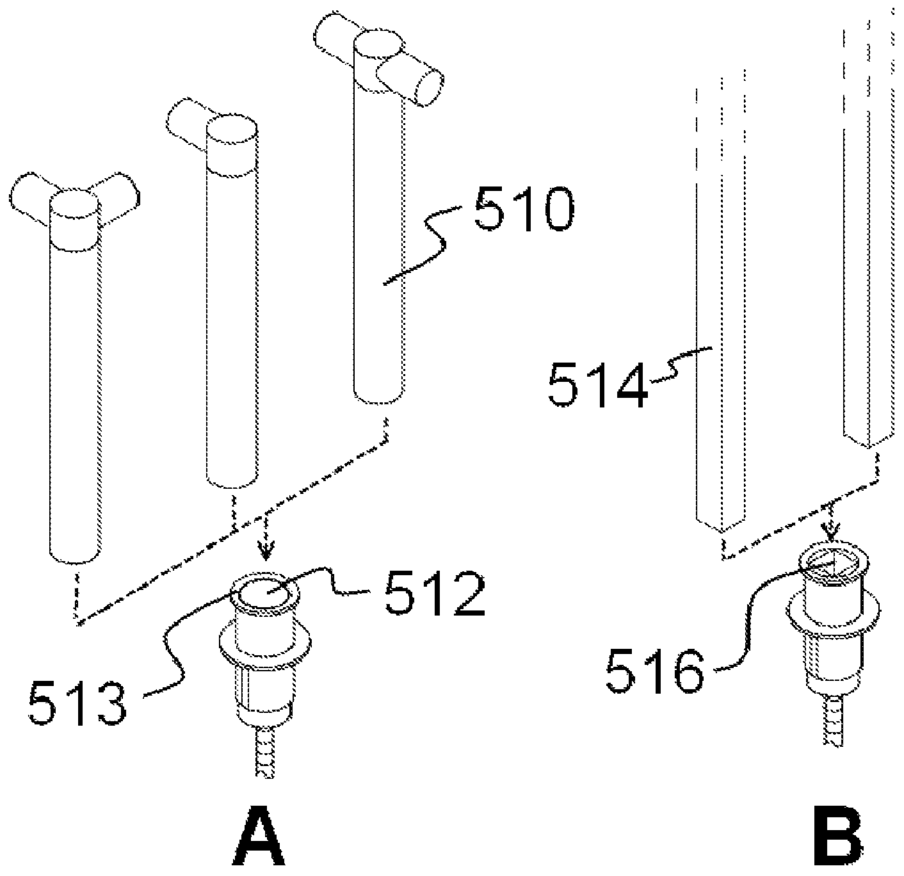
FIG. 5 illustrates alternative embodiments for a fixture support system.

FIG. 5 illustrates alternative embodiments for a fixture support system. In the FIG. 5A, a fixture support has a circular opening 512 through a top flange 513. The circular opening 512 allows for the insertion of circular arms 510 used for supporting electrical components. The arms in the FIG. 5A are configured in different shapes which may represent different options for lighting fixtures. Additionally, circular arms provide for rotation of the arm because a circular arm positioned inside a circular bore will be rotatable allowing for positioning of any electrical fixture attached to the circular arms 510.

In additional to the ability of a circular arm to rotate in a circular opening, the arm may be supported by a smaller diameter circular support (not shown). The circular support would be affixed to the support system and the circular arm 510 would be place over the circular support. A set screw or the like (not shown) may be threaded through the circular arm 510 to allow for locking the position of the circular arm 510 by passing through a threaded hole in the circular arm 510 and connecting to the circular support. Alternatively a set screw or the like may pass through a threaded hole in the body (similar to item 426 above).

The FIG. 5B shows a fixture support have a rectangular opening 516 along a top flange. The opening 516 may be sized to accommodate two rectangular arms 514 side-by-side. By positioning two rectangular arms 514 side-by-side different combinations of electrical components may be configured to meet a design requirement.

Rotation

Figure 6:
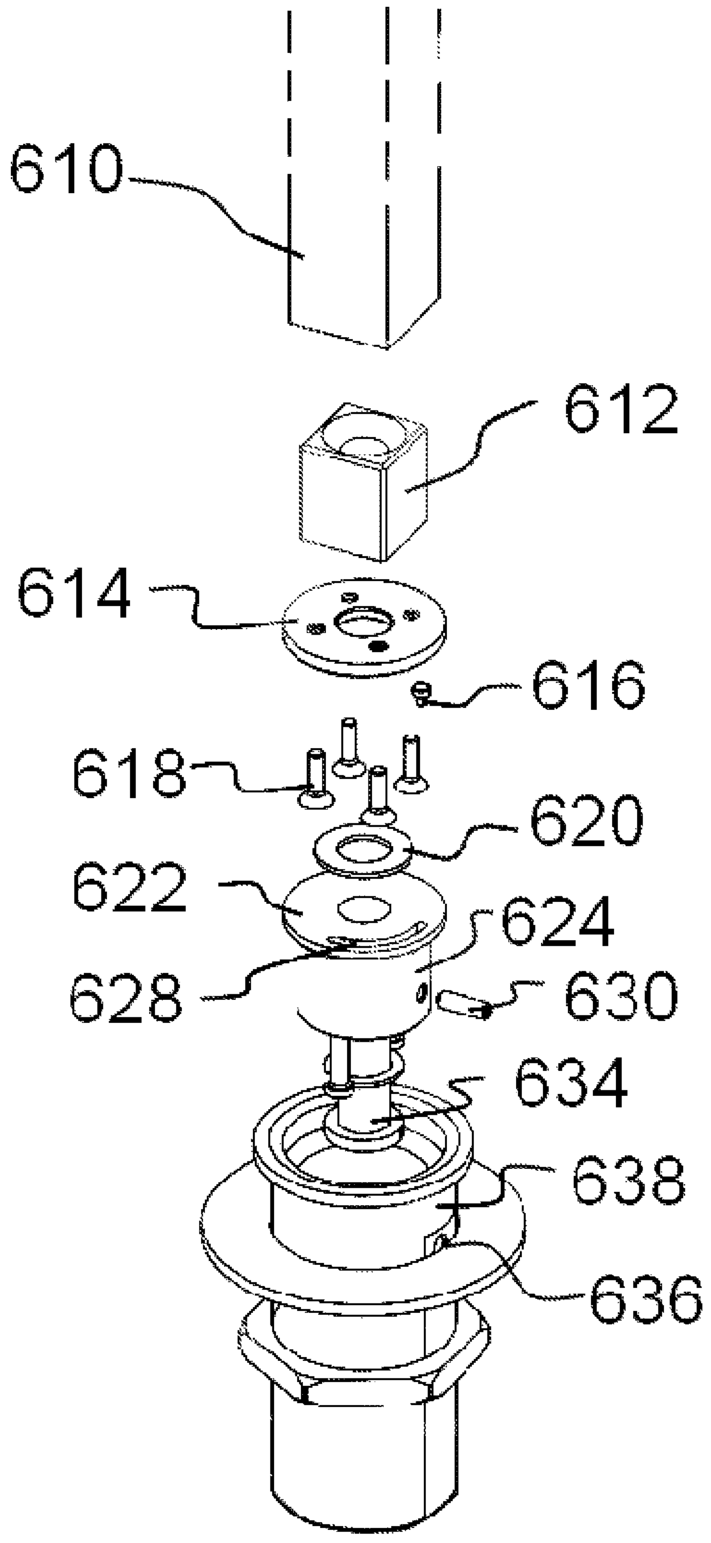
FIG. 6 shows an alternative embodiment for a rotational arm for a fixture support.

FIG. 6 shows an alternative embodiment for a rotational arm for a fixture support. In the FIG. 6 an arm 610, which may be of various shapes, is place over a mounting block 612, the mounting block disposed for receiving various shaped arms 610. The mounting block 612 is secured to a mounting plate 614 which is held into position by fasteners 618. The fasteners 618 may be screws, bolts or the like. The mounting plate 614 is disposed on a flat surface 622 of a cam 624 and separated by a washer 620. The flat surface 622 includes a groove or recess 628 for accepting a pin 616. The pin 616, which may be affixed to the mounting plate 614, allows for limits on the degree of rotation of the device as described below.

A lower portion of the cam 624 may be elongated such that the elongated portion 634 extends into a housing 638. The bottom surface of the elongate member 634 may be threaded (not shown) to allow the elongate member 634 to grasp the housing 638. Alternatively, the elongated member 634 may have a threaded receptacle (not shown) on the bottom surface) to allow for a screw, bolt or other fastener to grasp the elongated member 634 thus holding it in place in the housing 638.

A set screw 630 or the like may be disposed through a hole 636 in the housing 638 and into a threaded hole in the cam 622 thus allowing for the cam to be locked into place.

In operation, a support arm 610 is placed over the mounting block 612. When turned, the support arm 610 and the mounting block 612 turn together to the limits set by the pin 616 and groove 628. This provides for a securely mounted support structure with a rotatable arm support arm 610.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A device comprising:

a cylindrical body, said body having an internal cavity extending from a first end to a second end, and said body having an exterior threaded portion;

a flange affixed to the first end of the body, a portion of said flange extending past the circumference of the cylindrical body, said flange formed for receiving a substantially square hollow support arm, said hollow support arm supporting a luminaire, a plurality of threaded though-holes for receiving set screws, said set screws operative to secure the support arm in the internal cavity of the cylindrical body, and a fastener complementary to the threaded portion, said fastener having a threaded through-hole for receiving a set screw, said set screw operative to secure the fastener to the body, wherein the fastener and the flange are operable to secure the cylindrical body to a structure.

2. The device of claim 1 further including an annular retainer.

3. The device of claim 2 wherein the retainer is operable to distribute the load on the cylindrical body when positioned over the body and secured by the fastener.

4. The device of claim 1 wherein the fastener is a hex nut.

5. The device of claim 1 wherein the fastener is either a knurled nut or box nut.

6. The device of claim 1 wherein the structure is a desk or a table.

7. The device of claim 1 further including:

a conduit connector, said conduit connector coupled to said body.

8. A device comprising:

a cylindrical body, said body having an internal cavity extending from a first end to a second end, and said body having an exterior threaded portion;

a flange affixed to the first end of the body, a portion of said flange extending past the circumference of the cylindrical body, said flange formed for receiving a substantially rectangular hollow support arm, said hollow support arm supporting a luminaire, a plurality of threaded though-holes for receiving set screws, said set screws operative to secure the support arm in the internal cavity of the cylindrical body, and a fastener complementary to the threaded portion, said fastener having a threaded through-hole for receiving a set screw, said set screw operative to secure the fastener to the body, wherein the fastener and the flange are operable to secure the cylindrical body to a structure.

9. The device of claim 8 further including an annular retainer.

10. The device of claim 8 wherein the retainer is operable to distribute the load on the cylindrical body when positioned over the body and secured by the fastener.

11. The device of claim 8 wherein the fastener is a hex nut.

12. The device of claim 8 wherein the fastener is either a knurled nut or box nut.

13. The device of claim 8 wherein the structure is a desk or a table.

* * * * *